(12) United States Patent
Stancu et al.

(10) Patent No.: US 8,736,273 B2
(45) Date of Patent: May 27, 2014

(54) TESTING SYSTEM AND METHOD FOR TESTING A BATTERY CELL

(75) Inventors: Janina Stancu, La Salle (CA); Kenneth J. Oswandel, Livonia, MI (US)

(73) Assignee: LG Chem, Ltd., Seoul (KR)

( * ) Notice: Subject to any disclaimer, the term of this patent is extended or adjusted under 35 U.S.C. 154(b) by 393 days.

(21) Appl. No.: 13/073,033

(22) Filed: Mar. 28, 2011

(65) Prior Publication Data
US 2011/0254558 A1    Oct. 20, 2011

Related U.S. Application Data

(66) Substitute for application No. 61/324,616, filed on Apr. 15, 2010.

(51) Int. Cl.
*G01N 27/416* (2006.01)
*G01N 27/42* (2006.01)

(52) U.S. Cl.
USPC .......................... 324/426; 324/425; 324/430

(58) Field of Classification Search
USPC ......... 324/425, 426, 429, 430, 432, 447, 450; 320/104
See application file for complete search history.

(56) References Cited

U.S. PATENT DOCUMENTS

| | | | |
|---|---|---|---|
| 4,214,204 A | | 7/1980 | Eberle |
| 4,297,639 A | * | 10/1981 | Branham ...................... 324/429 |
| 4,363,407 A | | 12/1982 | Buckler et al. |
| 5,357,423 A | | 10/1994 | Weaver et al. |
| 5,426,371 A | * | 6/1995 | Salley et al. .................. 324/429 |
| 6,392,413 B2 | * | 5/2002 | Onishi et al. .................. 324/429 |
| 6,570,385 B1 | * | 5/2003 | Roberts et al. ................ 324/378 |
| 6,635,167 B1 | * | 10/2003 | Batman et al. ................ 205/775 |
| 6,762,610 B1 | * | 7/2004 | Brilmyer et al. ............. 324/691 |
| 7,109,700 B2 | * | 9/2006 | Fazzina ........................ 324/115 |
| 7,164,272 B1 | * | 1/2007 | Borrego Bel et al. ......... 324/429 |
| 7,205,746 B2 | * | 4/2007 | Batson .......................... 320/107 |
| 7,235,977 B2 | * | 6/2007 | Koran et al. .................. 324/426 |

(Continued)

FOREIGN PATENT DOCUMENTS

| | | | | |
|---|---|---|---|---|
| EP | 417575 A2 | * | 3/1991 | ............ G01R 31/36 |
| GB | 2291737 A | | 1/1996 | |

(Continued)

OTHER PUBLICATIONS

U.S. Appl. No. 13/626,915, filed Sep. 26, 2012 entitled System and Method for Determining an Isolation Resistance of a Battery Pack Disposed on a Vehicle Chassis.

*Primary Examiner* — Drew A Dunn
*Assistant Examiner* — Michael DiBenedetto
(74) *Attorney, Agent, or Firm* — Buckert Patent & Trademark Law Firm, P.C.; John F. Buckert

(57) ABSTRACT

A testing system and a method for testing a battery cell are provided. The system includes a nest member that receives the battery cell, and a clamping device that secures a first battery tab between first and second connectors, and secures a second battery tab between third and fourth connectors. The system further includes a voltmeter that measures a voltage level between the first and third connectors when the first and second battery tabs are contacting the first and third connectors, respectively. The system further includes an ohmmeter that measures a first resistance level between a first portion of the outer housing and the first connector when the first battery tab is contacting the first connector.

16 Claims, 7 Drawing Sheets

(56) References Cited

U.S. PATENT DOCUMENTS

| | | | |
|---|---|---|---|
| RE40,209 E * | 4/2008 | Sugihara et al. | 435/287.1 |
| 7,576,545 B2 * | 8/2009 | Singh et al. | 324/427 |
| 7,915,856 B2 * | 3/2011 | Krampitz et al. | 320/104 |
| 7,974,797 B2 * | 7/2011 | Shoji | 702/63 |
| 8,487,631 B2 * | 7/2013 | Yuasa et al. | 324/430 |
| 2001/0019270 A1 | 9/2001 | Onishi et al. | |
| 2003/0139888 A1 | 7/2003 | Burns | |
| 2004/0108856 A1 * | 6/2004 | Johnson | 324/426 |
| 2005/0134283 A1 | 6/2005 | Potempa | |
| 2005/0264296 A1 | 12/2005 | Philbrook | |
| 2006/0012341 A1 | 1/2006 | Burns | |
| 2006/0214626 A1 * | 9/2006 | Nilson et al. | 320/104 |
| 2007/0252555 A1 | 11/2007 | Potempa | |
| 2008/0231257 A1 | 9/2008 | Williams | |
| 2008/0290877 A1 * | 11/2008 | Oh et al. | 324/426 |
| 2009/0243621 A1 * | 10/2009 | Kudo et al. | 324/426 |
| 2009/0251149 A1 * | 10/2009 | Buckner et al. | 324/426 |
| 2010/0102975 A1 * | 4/2010 | Vossmeyer et al. | 340/636.19 |
| 2011/0050235 A1 * | 3/2011 | Bogdan et al. | 324/426 |
| 2011/0256430 A1 | 10/2011 | Stancu et al. | |
| 2013/0015702 A1 * | 1/2013 | Ito | 307/9.1 |
| 2013/0141105 A1 | 6/2013 | Tom et al. | |

FOREIGN PATENT DOCUMENTS

| | | |
|---|---|---|
| JP | S5999271 A | 6/1984 |
| JP | H0797004 A | 4/1995 |
| JP | H08185896 A | 7/1996 |
| JP | 2002343318 A | 11/2002 |
| JP | 2005228659 A | 8/2005 |

* cited by examiner

TESTING SYSTEM AND METHOD FOR TESTING A BATTERY CELL

CROSS-REFERENCE TO RELATED APPLICATIONS

This application claims priority to U.S. Provisional Patent Application No. 61/324,616 filed on Apr. 15, 2010, the entire contents of which are hereby incorporated by reference herein.

BACKGROUND

This application relates generally to a testing system and a method for testing a battery cell.

The inventors herein have recognized that battery cells need to be tested for a voltage between the battery tabs and electrical isolation between the batter tabs and a thin layer of aluminum exposed around the cell, in order to qualify the cells as acceptable.

SUMMARY

A testing system for a battery cell in accordance with an exemplary embodiment is provided. The battery cell has an outer housing and first and second battery tabs extending from the outer housing. The testing system includes a nest member configured to receive the battery cell thereon. The testing system further includes a clamping device configured to secure the first battery tab between first and second connectors, and to secure the second battery tab between third and fourth connectors. The testing system further includes a voltmeter configured to measure a voltage level between the first and third connectors when the first and second battery tabs are contacting the first and third connectors, respectively, and to send a voltage level value indicative of the voltage level to a computer. The testing system further includes an ohmmeter configured to measure a first resistance level between a first portion of the outer housing and the first connector when the first battery tab is contacting the first connector and to send a first resistance level value indicative of the first resistance level to the computer. The computer is configured to generate a validation message indicating the battery cell is operating as desired if the voltage level is within a desired voltage level range and the first resistance level is within a first resistance level range.

A method of testing a battery cell disposed on a nest member of a testing system in accordance with another exemplary embodiment is provided. The method includes securing a first battery tab of the battery cell between first and second connectors utilizing a clamping device. The method further includes securing a second battery tab of the battery cell between third and fourth connectors utilizing the clamping device. The method further includes measuring a voltage level between the first and third connectors when the first and second battery tabs are contacting the first and third connectors, respectively, utilizing a voltmeter. The method further includes sending a voltage level value indicative of the voltage level from the voltmeter to a computer. The method further includes measuring a first resistance level between a first portion of the outer housing and the first connector when the first battery tab is contacting the first connector utilizing an ohmmeter. The method further includes sending a first resistance level value indicative of the first resistance level from the ohmmeter to the computer. The method further includes generating a validation message indicating the battery cell is operating as desired if the voltage level is within a desired voltage level range and the first resistance level is within a first resistance level range utilizing the computer.

These and other advantages and features will become more apparent from the following description taken in conjunction with the drawings.

DETAILED DESCRIPTION

Figure 1:
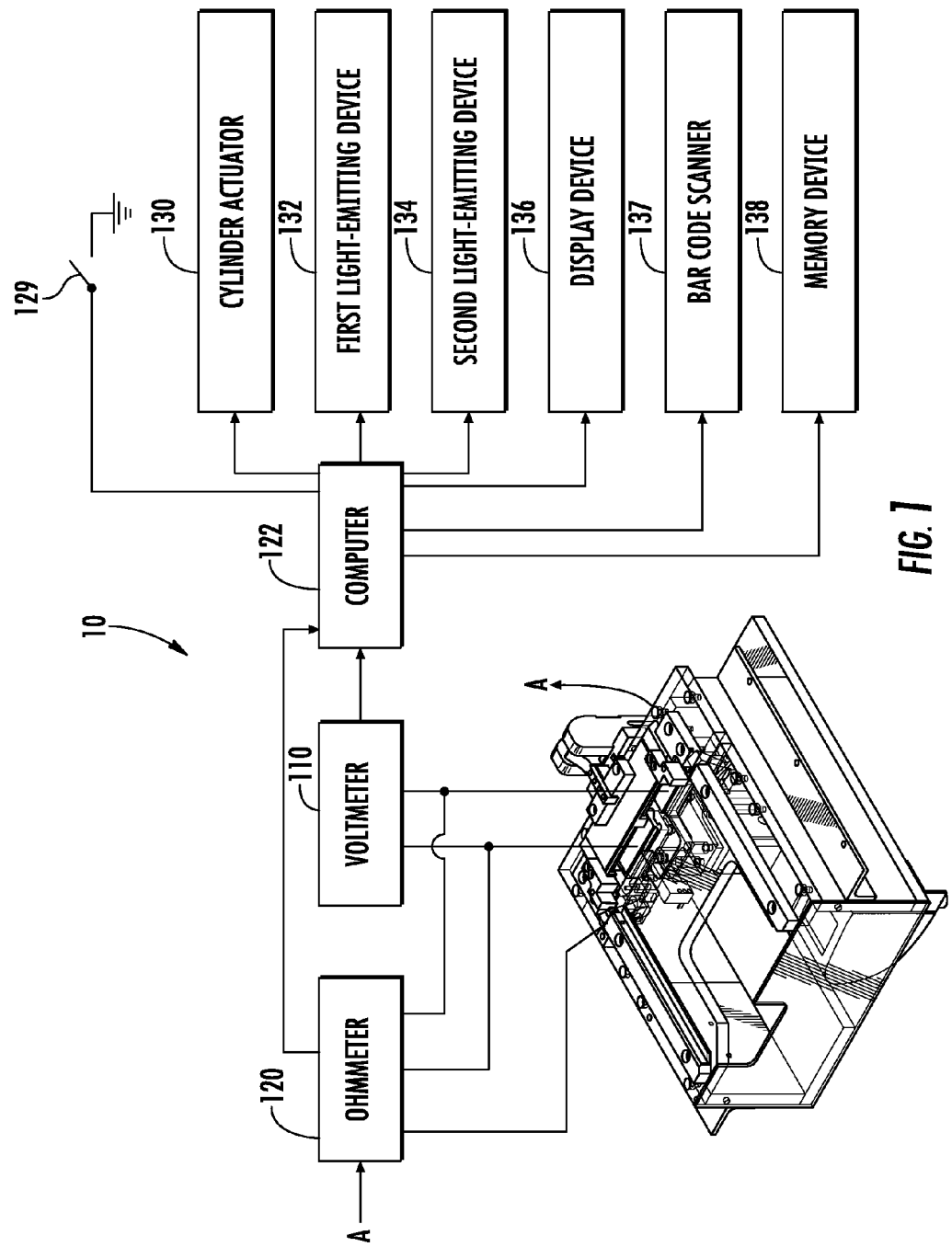
FIG. 1 is a schematic of a testing system for testing a battery cell in accordance with an exemplary embodiment.

Referring to FIGS. 1-6, a testing system 10 for testing a battery cell 20 in accordance with an exemplary embodiment is provided. The battery cell 20 includes an outer housing 30 having first and second battery tabs 32, 34 extending outwardly from the outer housing 30. In one exemplary embodiment the battery cell 20 is a lithium-ion pouch-type battery cell. Of course, in alternative embodiments, other types of battery cells known to those skilled in the art could be tested utilizing the testing system 10.

The testing system 10 includes a nest member 50, a clamping device 52, first, second, third and fourth connectors 60, 62, 64, 66, a cylinder 80, a plate 82, first and second swing arm assemblies 84, 86, first and second contacts 90, 92, a voltmeter 110, an ohmmeter 120, a computer 122, a switch 129, a cylinder actuator 130, first and second light-emitting devices 132, 134, a display device 136, and a bar code scanner 137.

Figure 4:
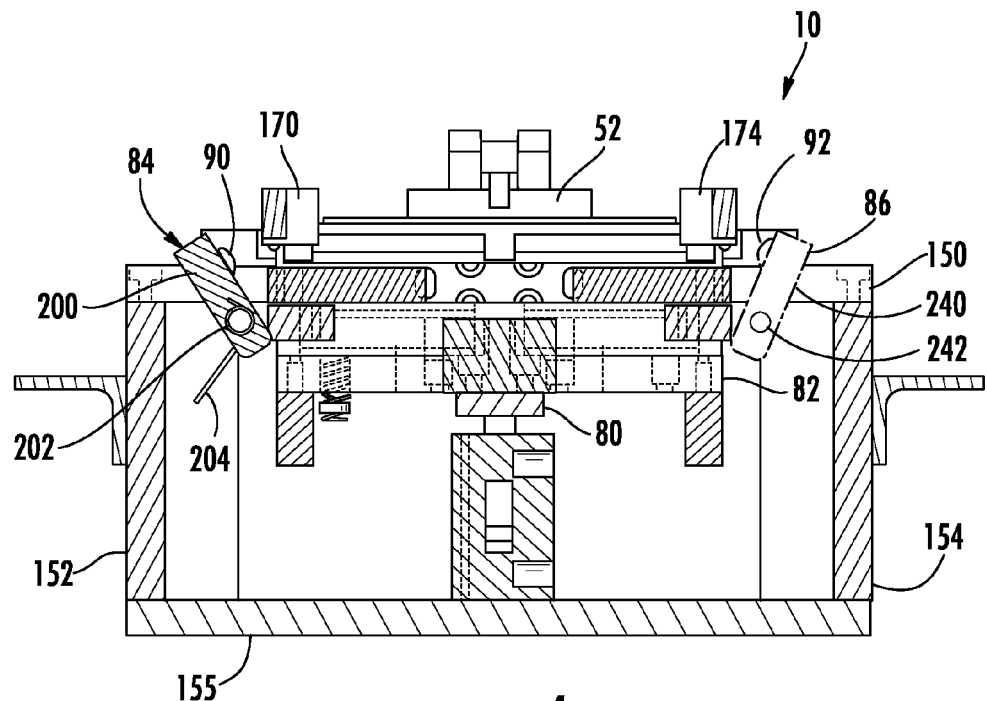
FIG. 4 is a cross-sectional schematic of a portion of the testing system of FIG. 1.
Figure 5:
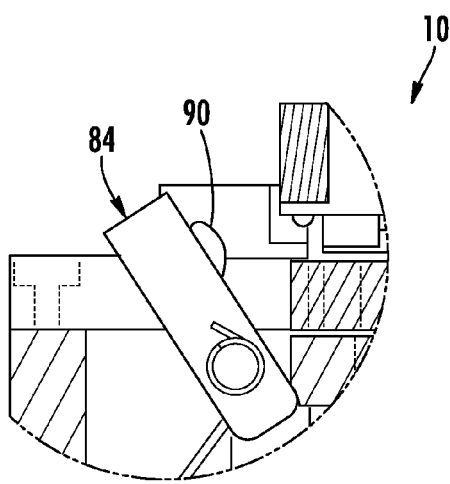
FIG. 5 is an enlarged view of a portion of the cross-sectional schematic of FIG. 4.
Figure 6:
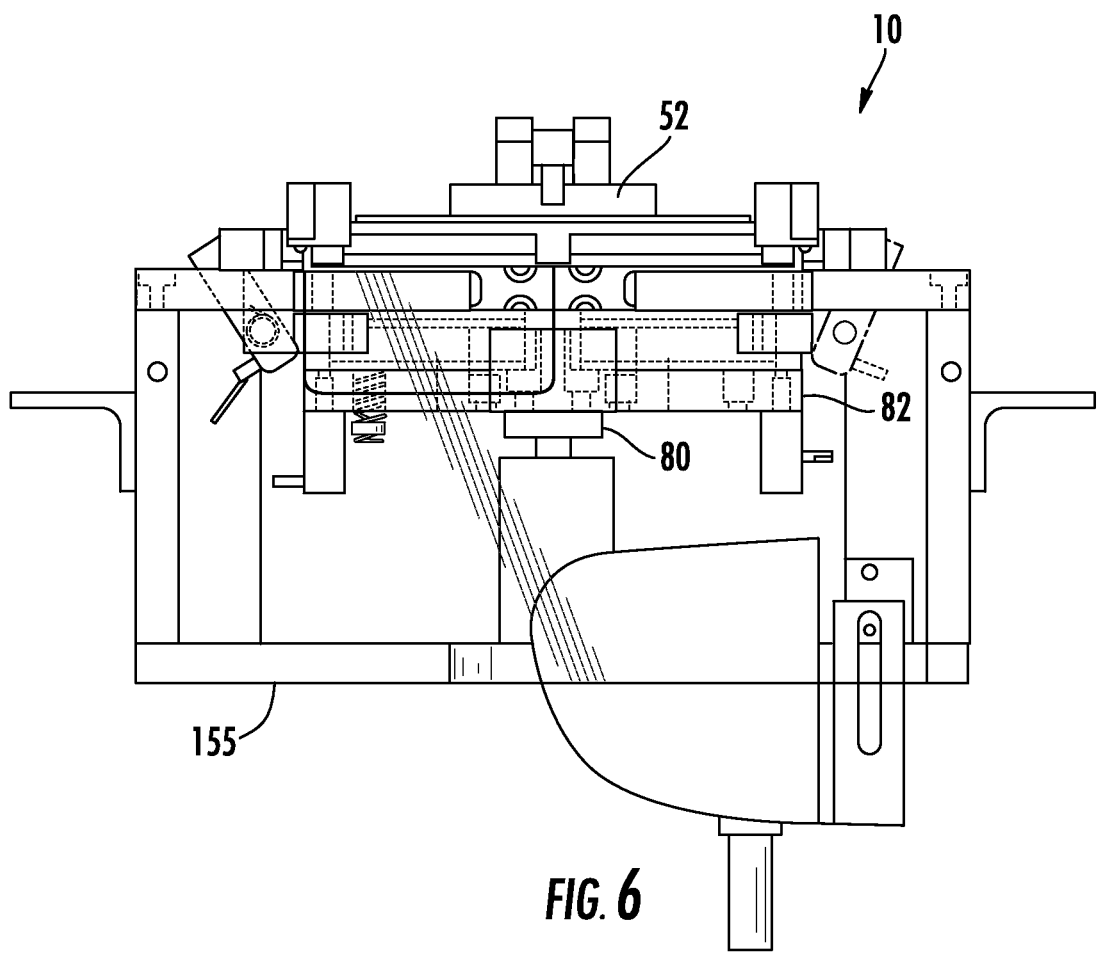
FIG. 6 is another cross-sectional schematic of a portion of the testing system of FIG. 1.

Referring to FIGS. 1 and 4, the nest member 50 is configured to receive the battery cell 20 therein. The nest member 50 includes a top plate 150, and side plates 152, 154, a bottom plate 155, and guide members 170, 172, 174, 176. In one exemplary embodiment, the top plate 150, the side plates 152, 154, the bottom plate 155, and the guide members 170, 172, 174, 176 are constructed of plastic. Of course, in alternative embodiment, the plates and guide members could be constructed of other non-conductive materials known to those skilled in the art. The side plates 152, 154 are further coupled to opposite ends of the top plate 150, and the side plates 152, 154 are coupled to opposite ends of the bottom plate 155. The guide members 170, 174 are coupled to a top surface of the top plate 150 and are disposed parallel to one another. The guide members 170, 174 are spaced and configured to allow a user to position the battery cell 20 therebetween. The guide members 172, 176 are coupled to a top surface of the top plate 150 proximate to the guide members 170, 174, respectively. The guide members 172, 176 are configured to define a forward position of the battery cell 20 on the nest member 50.

Figure 2:
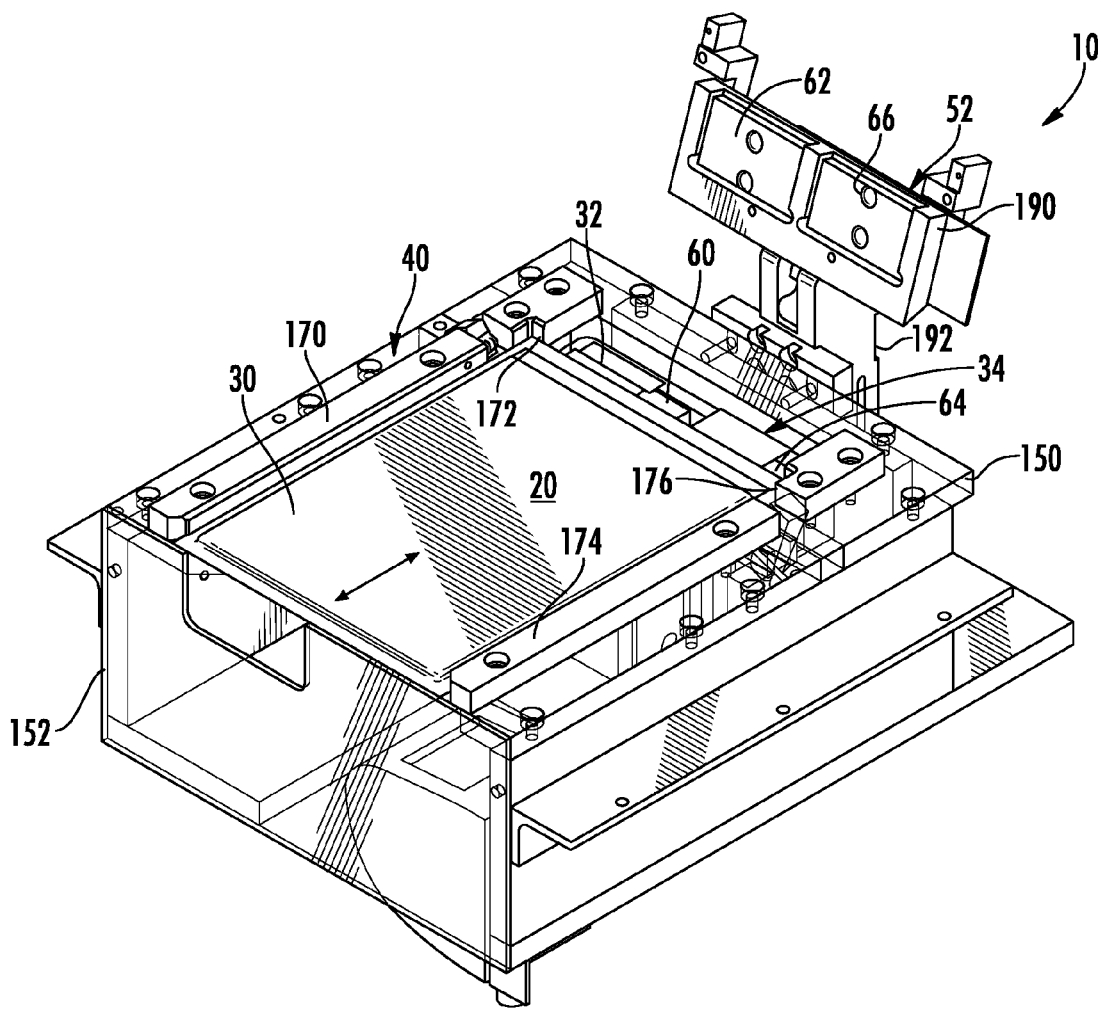
FIG. 2 is an enlarged schematic of a portion of the testing system of FIG. 1.
Figure 3:
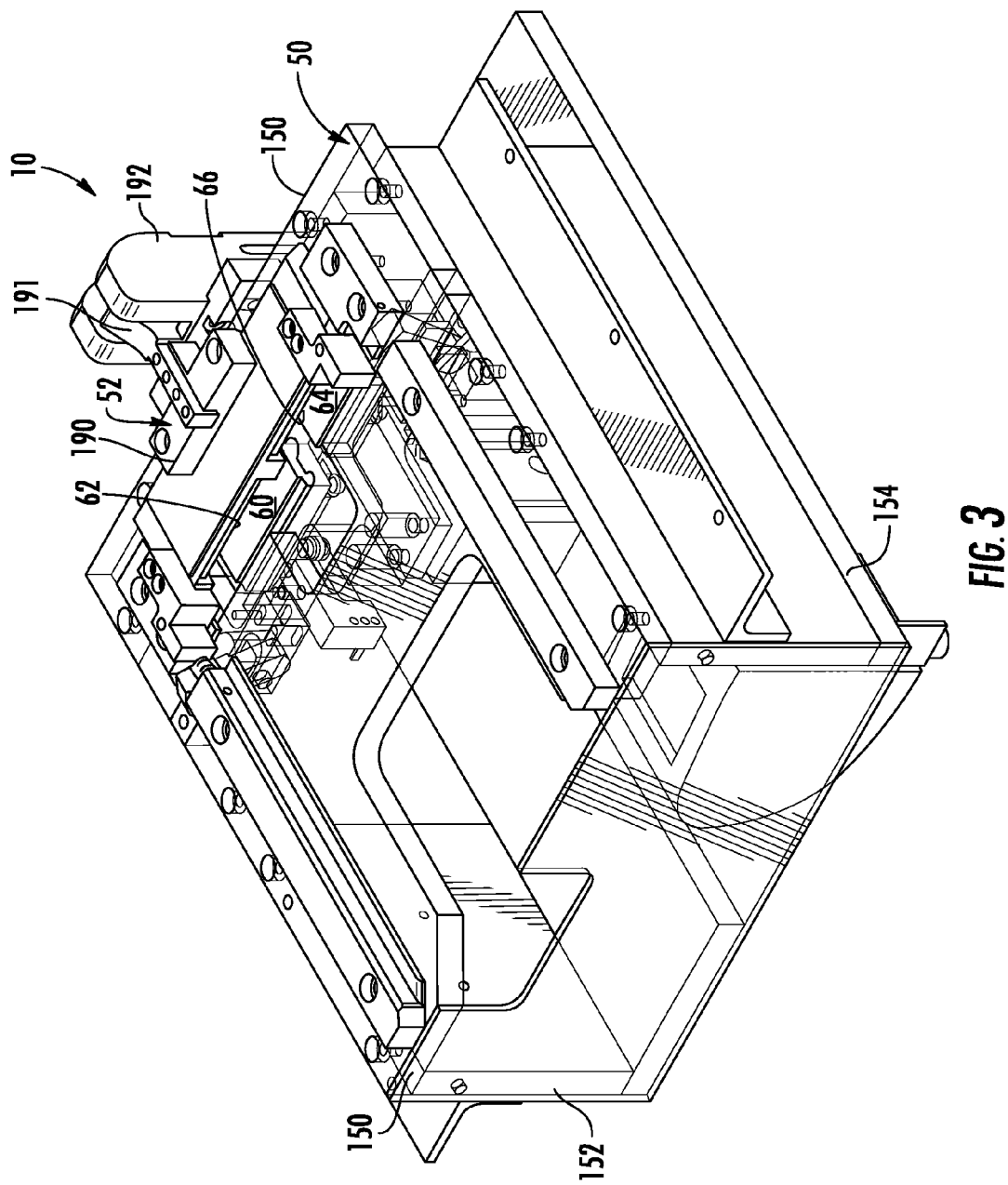
FIG. 3 is another enlarged schematic of a portion of the testing system of FIG. 1.

Referring to FIGS. 2 and 3, the clamping device 52 is configured to secure the first battery tab 32 between first and second connectors 60, 62, and to secure the second battery tab 34 between third and fourth connectors 64, 66. The first and third connectors 60, 64 are disposed on the top plate 150 and are constructed of a conductive metal or metal-alloy. The clamping device 52 includes a rotatable plate 190, a rotatable member 191, a support member 192, and a pivot shaft (not shown). The second and fourth connectors 62, 66 are coupled to a bottom surface of the rotatable plate 190 and are constructed of a conductive metal or metal-alloy. The support member 192 is coupled to a top surface of the top plate 150. The rotatable plate 190 is coupled to the rotatable member 191. The rotatable member 191 is rotatably coupled to the support member 192 via the pivot shaft (not shown) disposed on the support member 192.

Referring to FIGS. 2 and 4, the rotatable member 191 is operably coupled to the cylinder 80 such that when the cylinder 80 has a lowered operational position, the rotatable member 191 moves the rotatable plate 190 to a first operational position such that the rotatable plate 190 is disposed away from the first and second battery tabs 32, 34. In the first operational position, the battery cell 20 can be disposed in the nest member 50 or removed from the nest member 50.

Also, referring to FIGS. 3 and 4, the rotatable member 191 is operably coupled to the cylinder 80 such that when the cylinder 80 has a raised operational position, the rotatable member 191 moves the rotatable plate 190 to a second operational position such that the rotatable plate 190 is disposed toward the first and second battery tabs 32, 34 to secure the first battery tab 32 between first and second connectors 60, 62, and to secure the second battery tab 34 between third and fourth connectors 64, 66. When the cylinder 80 has the raised operational position, the battery cell 20 is tested as will be explained in greater detail below.

Referring to FIGS. 1 and 4-6, the cylinder 80 is coupled to the bottom plate 155 and is operably coupled to the plate 82 and to the rotatable member 191. When the switch 129 has a closed operational position, the computer 122 generates a first control signal to induce the cylinder actuator 130 to urge the cylinder 80 to a raised operational position. Alternately, when the switch 129 has an open operational position, the computer 122 generates a second control signal to induce the cylinder actuator 130 to urge the cylinder 80 to a lowered operational position.

The first swing arm assembly 84 is configured to move the first contact 90 to contact a first portion of the outer housing 30 for obtaining a resistance measurement that will be described in greater detail below. The first swing arm assembly 84 includes a plate 200, a pivot shaft 202 and a spring 204. The plate 200 has an aperture extending therethrough that receives the pivot shaft 202 therein. The pivot shaft 202 is further received in an aperture in the plate 82. Also, the spring 204 biases the plate 200 outwardly away from the battery cell 20. The first contact 90 is disposed on the plate 200 proximate to the battery cell 20. When the cylinder 80 moves from a lowered operational position to a raised operational position, the cylinder 80 moves the plate 82 upwardly which induces the plate 200 to rotate toward the battery cell 20 such that the first contact 90 contacts a first portion of the outer housing 30. Alternately, when the cylinder 80 moves from the raised operational position to the lowered operational position, the cylinder 80 moves the plate 82 downwardly which induces the plate 200 to rotate away from the battery cell 20 such that the first contact 90 no longer contacts the first portion of the outer housing 30.

The second swing arm assembly 86 is configured to move the second contact 92 to contact a second portion of the outer housing 30 for obtaining a resistance measurement that will be described in greater detail below. The second swing arm assembly 86 includes a plate 240, a pivot shaft 242 and a spring (not shown). The plate 240 has an aperture extending therethrough that receives the pivot shaft 242 therein. The pivot shaft 242 is further received in an aperture in the plate 82. The spring biases the plate 240 outwardly away from the battery cell 20. Also, the second contact 92 is disposed on the plate 240 proximate to the battery cell 20. When the cylinder 80 moves from the lowered operational position to the raised operational position, the cylinder 80 moves the plate 82 upwardly which induces the plate 240 to rotate toward the battery cell 20 such that the second contact 92 contacts the second portion of the outer housing 30. Alternately, when the cylinder 80 moves from the raised operational position to the lowered operational position, the cylinder 80 moves the plate 82 downwardly which induces the plate 240 to rotate away from the battery cell 20 such that the second contact 92 no longer contacts the first portion of the outer housing 30.

Referring to FIGS. 1 and 2, the voltmeter 110 is electrically coupled to the first and third connectors 60, 64. When the connectors 60, 64 are electrically coupled to the first and second battery tabs 32, 24, the voltmeter 110 measures a voltage level between the tabs 32, 34 and the connectors 60, 64. The voltmeter 110 is configured to send a voltage level value indicative of the voltage level to the computer 122.

The ohmmeter 120 is electrically coupled to the first and third connectors 60, 64 and to the first and second contacts 90, 92. The ohmmeter 120 measures a first resistance level between a first portion of the outer housing 30 and the first connector 60 when the first battery tab 32 is contacting the first connector 60 and sends a first resistance level value indicative of the first resistance level to the computer 122. The ohmmeter 120 also measures a second resistance level between the first portion of the outer housing 30 and the third connector 64 when the second battery tab 34 is contacting the third connector 64 and sends a second resistance level value indicative of the second resistance level to the computer 122. Further, the ohmmeter 120 measures a third resistance level between the first portion of the outer housing 30 and a second portion of the outer housing 30 and sends a third resistance level value indicative of the third resistance level to the computer 122.

The computer 122 is operably coupled to the voltmeter 110, the ohmmeter 120, the switch 129, the cylinder actuator 130, the first light-emitting device 132, the second light-emitting device 134, the display device 136, and the bar code scanner 137. The computer 122 controls operation of the voltmeter 110, the ohmmeter 120, the cylinder actuator 130, the first light-emitting device 132, the second light-emitting device 134, and the display device 136 to perform voltage tests and resistance tests on the battery cell 20 as will be explained in greater detail below.

The cylinder actuator 130 is operably coupled to the cylinder 80 and to the computer 122. The cylinder actuator 130 receives a first control signal from the computer 122 and induces the cylinder 80 to move upwardly. Alternately, the cylinder actuator 130 receives a second control signal from the computer 122 and induces the cylinder 80 to move downwardly.

The bar code scanner 130 is disposed proximate to the battery cell 20 and scans a bar code disposed on the battery cell 20. The bar code scanner 130 can send bar code data obtained from the bar code including a battery cell identifier to the computer 120. The computer 120 can retrieve desired operational parameters (e.g., a first resistance level range, a second resistance level range, a third resistance level range, and a voltage range) associated with the battery cell 20 from the memory device 138 based on the battery cell identifier.

Figure 7:
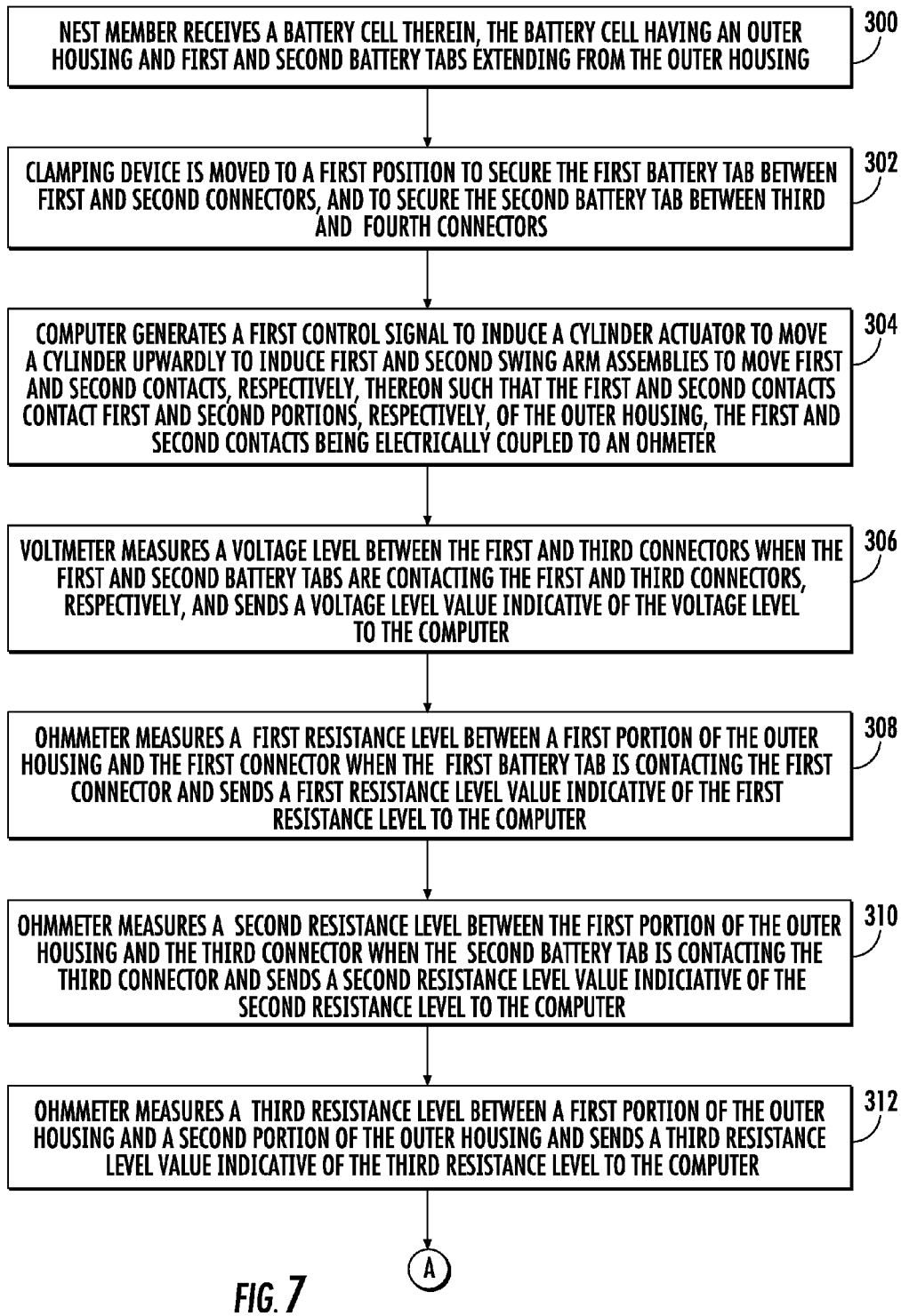
FIGS. 7 and 8 are flowcharts of a method for testing a battery cell in accordance with another exemplary embodiment.
Figure 8:
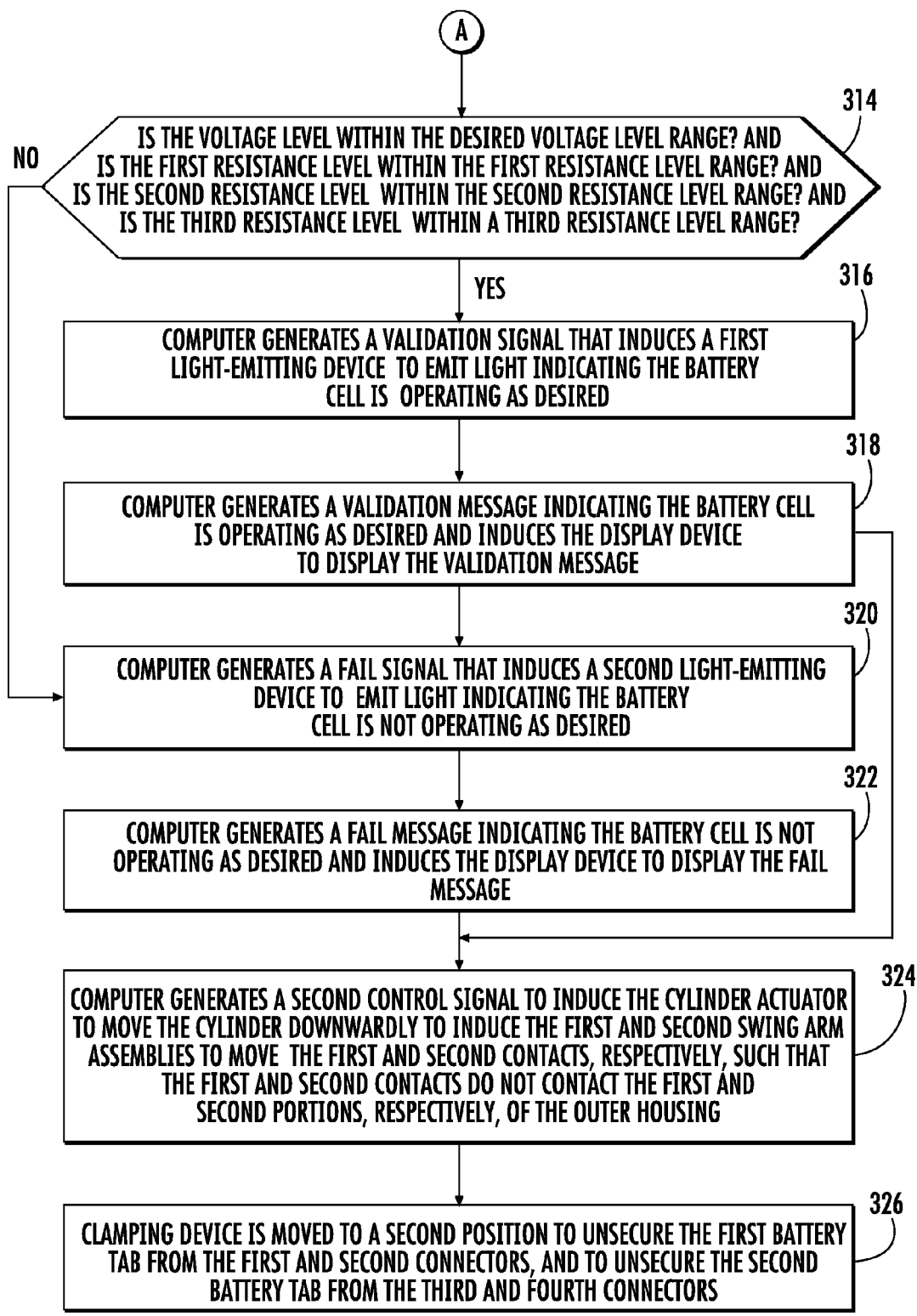

Referring to FIGS. 1 and 7-8, a flowchart of a method for testing the battery cell 20 utilizing the testing system 10 in accordance with another exemplary embodiment will now be explained.

At step 300, the nest member 50 receives the battery cell 20 therein. The battery has an outer housing 30 and first and second battery tabs 32, 34 extending from the outer housing 30.

At step 302, the clamping device 52 is moved to a first position to secure the first battery tab 32 between first and second connectors 60, 62 and to secure the second battery tab 34 between third and fourth connectors 64, 66.

At step 304, the computer 122 generates a first control signal to induce the cylinder actuator 130 to move the cylinder 80 upwardly to induce the first and second swing arm assemblies 84, 86 to move first and second contacts 90, 92, respectively, thereon such that the first and second contacts 90, 92 contact first and second portions, respectively, of the outer housing 30. The first and second contacts 90, 92 are electrically coupled to the ohmmeter 120.

At step 306, the voltmeter 110 measures a voltage level between the first and third connectors 60, 64 when the first and second battery tabs 32, 34 are contacting the first and third connectors 60, 64, respectively, and sends a voltage level value indicative of the voltage level to the computer 122.

At step 308, the ohmmeter 120 measures a first resistance level between a first portion of the outer housing 30 and the first connector 60 when the first battery tab 32 is contacting the first connector 60 and sends a first resistance level value indicative of the first resistance level to the computer 122.

At step 310, the ohmmeter 120 measures a second resistance level between the first portion of the outer housing 30 and the third connector 64 when the second battery tab 34 is contacting the third connector 64 and sends a second resistance level value indicative of the second resistance level to the computer 122.

At step 312, the ohmmeter 120 measures a third resistance level between the first portion of the outer housing 30 and a second portion of the outer housing 30 and sends a third resistance level value indicative of the third resistance level to the computer 122.

At step 314, the computer 122 makes a determination as to whether the voltage level is within the desired voltage level range, and whether the first resistance level is within the first resistance level range, and whether the second resistance level is within the second resistance level range, and whether the third resistance level is within a third resistance level range. If the value of step 314 equals "yes", the method advances to step 316. Otherwise, the method advances to step 320.

At step 316, the computer 122 generates a validation signal that induces the first light-emitting device 132 to emit light indicating the battery cell 20 is operating as desired. After step 316, the method advances to step 318.

At step 318, the computer 122 generates a validation message indicating the battery cell 20 is operating as desired and induces the display device 136 to display the validation message. After step 318, the method advances to step 324.

Referring again to step 314, if the value of step 314 equals "no", the method advances to step 320. At step 320, the computer 122 generates a fail signal that induces the second light-emitting device 134 to emit light indicating the battery cell 20 is not operating as desired. After step 320, the method advances to step 322.

At step 322, the computer 122 generates a fail message indicating the battery cell 20 is not operating as desired and induces the display device 136 to display the fail message. After step 322, the method advances to step 324.

At step 324, the computer 122 generates a second control signal to induce the cylinder actuator 130 to move the cylinder 80 downwardly to induce the first and second swing arm assemblies 84, 86 to move the first and second contacts 90, 92, respectively, such that the first and second contacts 90, 92 do not contact the first and second portions, respectively, of the outer housing 30. After step 324, the method advances to step 326.

At step 326, the clamping device 52 is moved to a second position to unsecure the first battery tab 32 from the first and second connectors 60, 62, and to unsecure the second battery tab 34 from the third and fourth connectors 64, 66.

The testing system and method for testing a battery cell provides a substantial advantage over other systems and methods. In particular, the testing system and method provide a technical effect of measuring both a voltage between the battery tabs, and a resistance between a battery tab and an outer housing of the battery cell, while the battery cell is held within a nest member for quick and efficient testing of a battery cell.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

We claim:

1. A testing system for a battery cell therein, the battery cell having an outer housing and first and second battery tabs extending from the outer housing, comprising:

a nest member having a top plate and first and second guide members, the first and second guide members being coupled to a top surface of the top plate and being disposed parallel to one another, the top plate and the first and second guide members defining a region for receiving the battery cell on the top surface;

a clamping device having a rotatable plate that is rotatably coupled to a support member, the rotatable plate having first and third connectors disposed on a bottom surface of the rotatable plate, the rotatable plate configured to secure the first battery tab between the first connector and a second connector, and to secure the second battery tab between the third connector and a fourth connector;

a voltmeter electrically coupled to the first and third connectors on the rotatable plate of the clamping device, the voltmeter configured to measure a voltage level between the first and third connectors when the first and second battery tabs are contacting the first and third connectors, respectively, and to send a voltage level value indicative of the voltage level to a computer;

an ohmmeter electrically coupled to the first connector on the rotatable plate, the ohmmeter configured to measure a first resistance level between a first portion of the outer housing and the first connector when the first battery tab is contacting the first connector and to send a first resistance level value indicative of the first resistance level to the computer; and the computer configured to generate a validation message indicating the battery cell is operating as desired if the voltage level is within a desired voltage level range and the first resistance level is within a first resistance level range.

2. The testing system of claim 1, wherein the ohmmeter is electrically coupled to the third connector on the rotatable plate, the ohmmeter is further configured to measure a second resistance level between the first portion of the outer housing and the third connector when the second battery tab is contacting the third connector and to send a second resistance level value indicative of the second resistance level to the computer.

3. The testing system of claim 2, wherein the computer is further configured to generate the validation message indicating the battery cell is operating as desired if the voltage level is within the desired voltage level range, and the first resistance level is within the first resistance level range, and the second resistance level is within a second resistance level range.

4. The testing system of claim 2, wherein the ohmmeter is further configured to measure a third resistance level between the first portion of the outer housing and a second portion of the outer housing and to send a third resistance level value indicative of the third resistance level to the computer.

5. The testing system of claim 4, wherein the computer is further configured to generate the validation message indicating the battery cell is operating as desired if the voltage level is within the desired voltage level range, and the first resistance level is within the first resistance level range, and the second resistance level is within the second resistance level range, and the third resistance level is within a third resistance level range.

6. The testing system of claim 1, further comprising:
a first swing arm assembly having a first contact, the first swing arm assembly configured to move the first contact such that the first contact contacts the first portion of the outer housing of the battery cell; and
the ohmmeter being electrically coupled to the first contact, the ohmmeter being configured to measure the first resistance level between the first contact and the first connector when the first battery tab is contacting the first connector and the first contact is contacting the outer housing.

7. The testing system of claim 1, wherein the computer is further configured to induce a display device to display the validation message.

8. The testing system of claim 1, wherein the computer is further configured to generate a fail message indicating the battery cell is not operating as desired if the voltage level is not within the desired voltage level range or if the first resistance level is not within the first resistance level range.

9. The testing system of claim 8, wherein the computer is further configured to induce a display device to display the fail message.

10. A method of testing a battery cell disposed on a nest member of a testing system, comprising:
providing a nest member having a top plate and first and second guide members, the first and second guide members being coupled to a top surface of the top plate and being disposed parallel to one another;
disposing the battery cell on the top surface of the top plate between the first and second guide members;
securing a first battery tab of the battery cell between first and second connectors utilizing a clamping device;
securing a second battery tab of the battery cell between third and fourth connectors utilizing the clamping device;
measuring a voltage level between the first and third connectors when the first and second battery tabs are contacting the first and third connectors, respectively, utilizing a voltmeter;
sending a voltage level value indicative of the voltage level from the voltmeter to a computer;
measuring a first resistance level between a first portion of the outer housing and the first connector when the first battery tab is contacting the first connector utilizing an ohmmeter;
sending a first resistance level value indicative of the first resistance level from the ohmmeter to the computer;
generating a validation message indicating the battery cell is operating as desired if the voltage level is within a desired voltage level range and the first resistance level is within a first resistance level range utilizing the computer; and
generating a fail message indicating the battery cell is not operating as desired if the voltage level is not within the desired voltage level range or the first resistance level is not within the first resistance level range utilizing the computer.

11. The method of claim 10, further comprising:
measuring a second resistance level between the first portion of the outer housing and the third connector when the second battery tab is contacting the third connector utilizing the ohmmeter; and
sending a second resistance level value indicative of the second resistance level from the ohmmeter to the computer.

12. The method of claim 11, further comprising generating the validation message indicating the battery cell is operating as desired if the voltage level is within the desired voltage level range, and the first resistance level is within the first resistance level range, and the second resistance level is within a second resistance level range, utilizing the computer.

13. The method of claim 10, further comprising measuring a third resistance level between the first portion of the outer housing and a second portion of the outer housing utilizing the ohmmeter; and
sending a third resistance level value indicative of the third resistance level from the ohmmeter to the computer.

14. The method of claim 13, further comprising generating the validation message indicating the battery cell is operating as desired if the voltage level is within the desired voltage level range, and the first resistance level is within the first resistance level range, and the second resistance level is within the second resistance level range, and the third resistance level is within a third resistance level range, utilizing the computer.

15. The method of claim 10, further comprising displaying the validation message on a display device utilizing the computer.

16. The method of claim 10, further comprising displaying the fail message on a display device utilizing the computer.

* * * * *